(12) United States Patent
Patapoutian et al.

(10) Patent No.: US 8,406,051 B2
(45) Date of Patent: *Mar. 26, 2013

(54) ITERATIVE DEMODULATION AND DECODING FOR MULTI-PAGE MEMORY ARCHITECTURE

(75) Inventors: Ara Patapoutian, Hopkinton, MA (US); Deepak Sridhara, Boulder, CO (US); Bruce D. Buch, Westborough, MA (US)

(73) Assignee: Seagate Technology LLC, Cupertino, CA (US)

( * ) Notice: Subject to any disclaimer, the term of this patent is extended or adjusted under 35 U.S.C. 154(b) by 368 days.

This patent is subject to a terminal disclaimer.

(21) Appl. No.: 12/781,780

(22) Filed: May 17, 2010

(65) Prior Publication Data

US 2011/0280069 A1    Nov. 17, 2011

(51) Int. Cl.
*G11C 16/04*    (2006.01)
(52) U.S. Cl. .......... 365/185.03; 365/185.18; 365/185.12
(58) Field of Classification Search ............. 365/185.03, 365/185.18, 185.12
See application file for complete search history.

(56) References Cited

U.S. PATENT DOCUMENTS

| | | | |
|---|---|---|---|
| 6,522,580 | B2 | 2/2003 | Chen et al. |
| 7,411,858 | B2 | 8/2008 | Ju |
| 7,593,259 | B2 | 9/2009 | Kim |
| 7,596,022 | B2 | 9/2009 | Chae et al. |
| 2008/0177934 | A1 | 7/2008 | Yu et al. |
| 2011/0280068 | A1* | 11/2011 | Patapoutian et al. .... 365/185.03 |

FOREIGN PATENT DOCUMENTS

WO    WO2009/114618    9/2009

OTHER PUBLICATIONS

Caire et al., "Bit-Interleaved Coded Modulation", IEEE Transactions on Information Theory, vol. 44, No. 3, May 1998, pp. 927-946.
Gregori et al., "An Error Control Code Scheme for Multilevel Flash Memories", IEEE, 2001, 5 pages.
Imai et al., "A New Multilevel Coding Method Using Error-Correcting Codes", IEEE Transactions on Information Theory, vol. 23, No. 3, 1977, pp. 371-377.
Wachsmann et al., "Multilevel Codes: Theoretical Concepts and Practical Design Rules", IEEE Transactions on Information Theory, vol. 45, No. 5, Jul. 1999, pp. 1361-1391.
U.S. Appl. No. 12/781,774, filed May 17, 2010, Patapoutian et al.

* cited by examiner

*Primary Examiner* — Huan Hoang
(74) *Attorney, Agent, or Firm* — Hollingsworth Davis, LLC

(57) ABSTRACT

Methods and systems for accessing encoded data stored in a solid state non-volatile memory device include iteratively demodulating and decoding the data. The memory device includes memory cells arranged to store multiple bits of data per memory cell. The memory cells are capable of storing multiple pages of data. Each bit stored in a memory cell is associated with a page of data that is different from other pages associated with other bits stored in the memory cell. The multiple pages are demodulated responsive to sensed voltage levels of the memory cells, and a demodulated output is provided for each page of the multiple pages. A decoded output for each page of the multiple pages is generated. Decoding the page and demodulating the multiple pages proceeds iteratively, including an exchange of information between the decoder and the demodulator.

20 Claims, 10 Drawing Sheets

ITERATIVE DEMODULATION AND DECODING FOR MULTI-PAGE MEMORY ARCHITECTURE

SUMMARY

Various embodiments of the present invention are generally directed to accessing data in a solid state non-volatile memory device.

A method of accessing encoded data stored in a solid state non-volatile memory device involves sensing voltage levels of memory cells arranged to store multiple bits of data per memory cell. The multiple bits per memory cell are associated respectively with multiple pages of data. Each bit stored in a memory cell is associated with a page of data that is different from other pages associated with other bits stored in the memory cell. The multiple pages of the memory cells are demodulated responsive to the sensed voltage levels and a demodulated output is provided for each page of the multiple pages. A decoded output for each page of the multiple pages is generated. Generating the decoded output for each page involves receiving the demodulated output for the page and decoding the page responsive to the demodulated output. Decoding the page and demodulating the multiple pages proceeds iteratively, including an exchange of information between the decoding and the demodulating.

In some implementations, the information exchanged between the decoding and the demodulating includes only hard data estimates. In some implementations, the information exchanged between the decoding and the demodulating involves both hard data estimates and data confidence information. For example, the data confidence information for one page may be derived from decoding another page. The data confidence information for one page may be derived from demodulating the multiple pages. The data confidence information may be based on noise probability and/or may be based on the sensed voltage levels of the memory cells.

After the multiple pages are decoded, in some implementations, the non-requested page may be ignored and the decoded output of a requested page may be transferred to a host computer. In some implementations, the non-requested page may be stored in cache memory.

The data stored in the pages may be encoded using an error correction code which provides an opportunity for error detection and error recovery. For example, the error correction code may be a low density parity check code or a turbo code. The device may implement several processes including a first process for memory access with error recovery and a second process for on-the-fly memory access that may not involve error recovery. For example, the second process may perform fewer iterations than the first process or may perform no iterations.

In some examples, at least one page of the multiple pages is encoded using a code rate that is different from a code rate of another page of the multiple pages. The code rate for the at least one page may be selected to reduce the error rate of the at least one page relative to the other page of the multiple pages.

Iteratively decoding and demodulating involves global iterations in which extrinsic information is used by the decoding and/or the demodulating processes. In addition to performing global iterations, one or both of the decoding and the demodulating processes may also perform local iterations. The local iterations use information generated from at least one previous iteration of the decoding and/or demodulating.

A memory system includes a memory device having memory cells configured to store multiple bits of data per memory cell. The multiple bits per memory cell are associated respectively with multiple pages of data. Each bit stored in a memory cell is associated with a page of data that is different from other pages associated with other bits stored in the memory cell. Sensor circuitry is configured to sense voltage levels indicative of the multiple bits stored in the memory cells. A demodulator is configured to provide a demodulated output for each page of the multiple pages responsive to the sensed voltage levels. A decoder is configured to receive a demodulated output for each page of the multiple pages from the demodulator and to send a decoded output to the demodulator. The decoder and the demodulator exchange information and iteratively perform the processes of decoding and demodulating the multiple pages.

The information exchanged between the decoder and the demodulator may include hard data estimates and/or may include data confidence information. In some implementations, the demodulator implements a look-up table to determine the data confidence information. In some implementations, the demodulator calculates a function of a probability function, such as a log likelihood ratio, to determine the data confidence. The demodulator may be configured to determine the data confidence information in response to the sensed voltage levels of the memory cells and/or the data confidence information may be may be determined using noise variance.

The system may include a host computer and the decoder is configured to transfer a decoded output for one page of the multiple pages to the host computer and to discard a decoded output of another page of the multiple pages. The system may include a cache memory and a host computer and the decoder is configured to provide a decoded output of at least one page for storage in the cache memory and to provide a decoded output of at least another page to the host computer.

Each state of the multiple bits of each memory cell is represented by a memory cell voltage. In some implementations, the voltage differences between adjacent voltages that represent different states are non-uniform. In some implementations, the voltage differences between the adjacent voltages are selectable to reduce an error rate of one of the multiple pages relative to an error rate of another of the multiple pages.

In some implementations, the decoder may include first decoder circuitry and second decoder circuitry. The first decoder circuitry is configured to generate a decoded output for a first page of the multiple pages. The second decoder circuitry is configured to generate a decoded output for a second page of the multiple pages. In some implementations, the decoder includes circuitry configured to generate a decoded output for a first page of the multiple pages during a first time interval and to generate a decoded output for a second page of the multiple pages during a second time interval.

These and other features and aspects which characterize various embodiments of the present invention can be understood in view of the following detailed discussion and the accompanying drawings.

DETAILED DESCRIPTION

Multi-level non-volatile solid state memory (NVM) is attractive because it provides a significant increase in storage capacity per unit area over single level memory. Multi-level solid state NVM can be implemented using a multi-page architecture that stores multiple logical pages of data together in one physical page of memory. Multi-page architecture offers an opportunity to use information gained in the demodulation/decoding process of one of the logical pages to inform the demodulation/decoding process for other logical pages. The demodulator and the decoders can iteratively share information about the multiple logical pages stored in the physical page to detect and/or correct data errors.

Multi-level solid state NVM uses floating gate memory cells that can be programmed to store two or more bits of information. In general, the ability to program a memory cell to a number of voltages, M, where M can represent any of $2^m$ memory states, allows m bits to be stored in each memory cell. In multi-level memory storage devices, m is greater than or equal to 2. For example, memory cells programmable to two voltages can store one bit of data; memory cells programmable to four voltages can store two bits per cell; memory cells programmable to eight voltages have a storage capacity of three bits per cell, etc. Although this disclosure generally provides examples based on multi-level NVM capable of storing two bits per cell, the techniques described herein can be extended to multi-level NVM capable of storing three, four, or more bits in each memory cell.

Figure 1A:
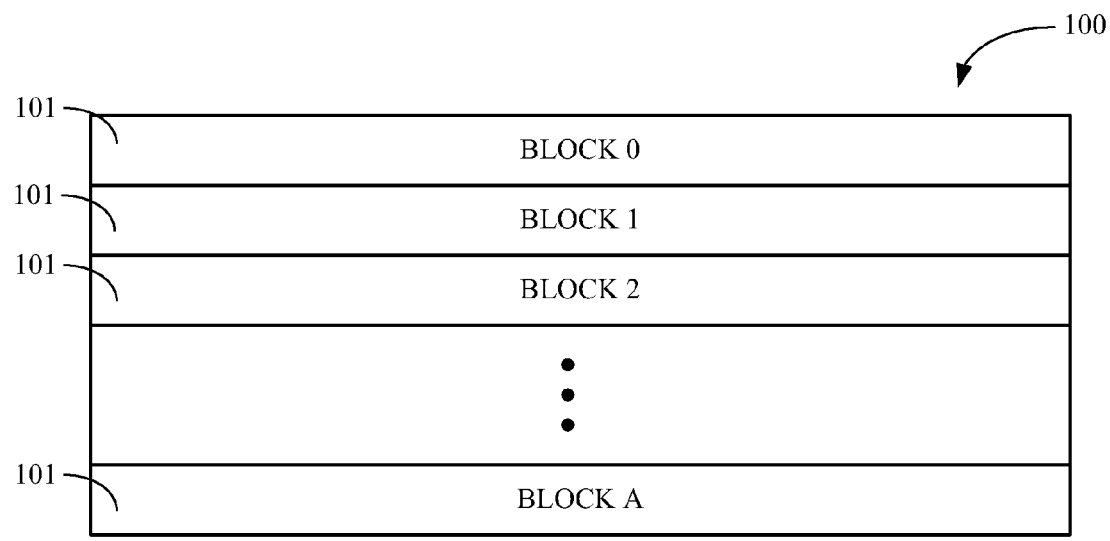
FIG. 1A is a diagram illustrating a memory cell array arranged in K blocks.
Figure 1B:
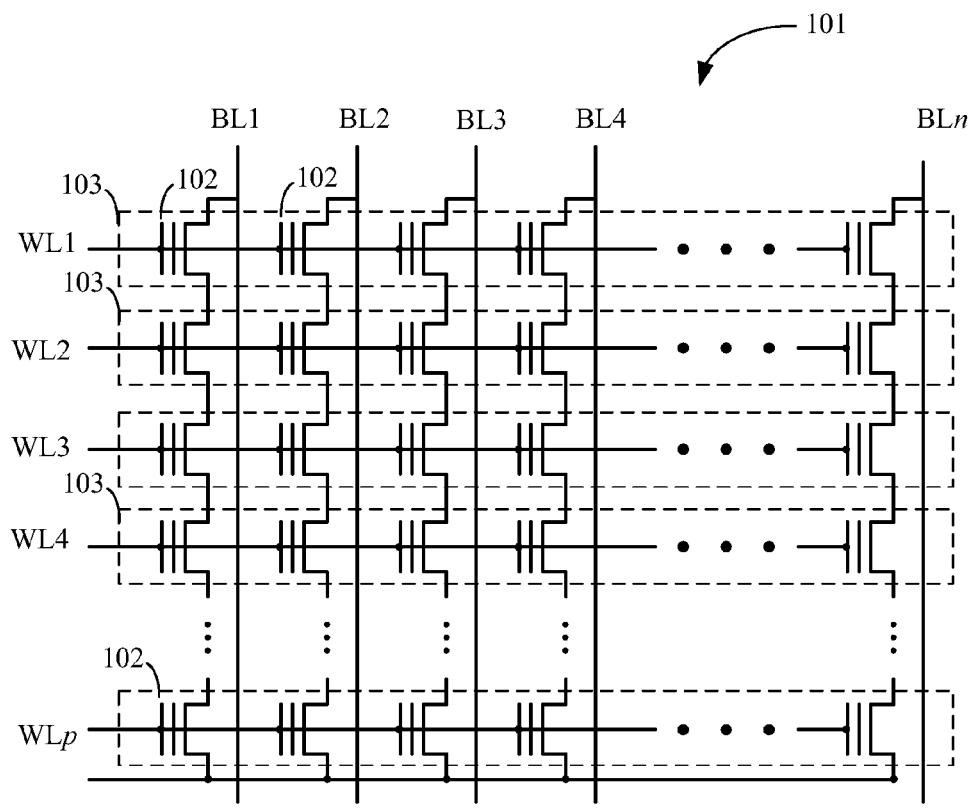
FIG. 1B is a diagram illustrating one block of a memory cell array having p physical pages and n NAND strings.

A multi-level NVM device comprises an array of memory cells, each memory cell comprising a floating gate transistor capable of storing multiple levels of charge. The memory cells in an array can be grouped into larger units, such as blocks, physical pages, and logical pages. An exemplary block size includes 64 physical pages of memory cells with 16,384 (16K) memory cells per physical page. Other block or page sizes can be used. FIG. 1A illustrates a memory cell array 100 arranged in A blocks 101. FIG. 1B illustrates one block 101 of a memory cell array. The memory cell array comprises p×n memory cells per block 101, the memory cells (floating gate transistors) 102 arranged p rows of physical pages 103 and in columns of n NAND strings. Each physical page 103 is associated with a word line $WL_1$-$WL_p$. When a particular word line is energized, the n memory cells of the physical page 103 associated with that particular word line are accessible on bit lines $BL_1$-$BL_n$. In alternate embodiments, the memory cells of the solid state NVM may be arranged in a NOR array, for example.

Figure 1C:
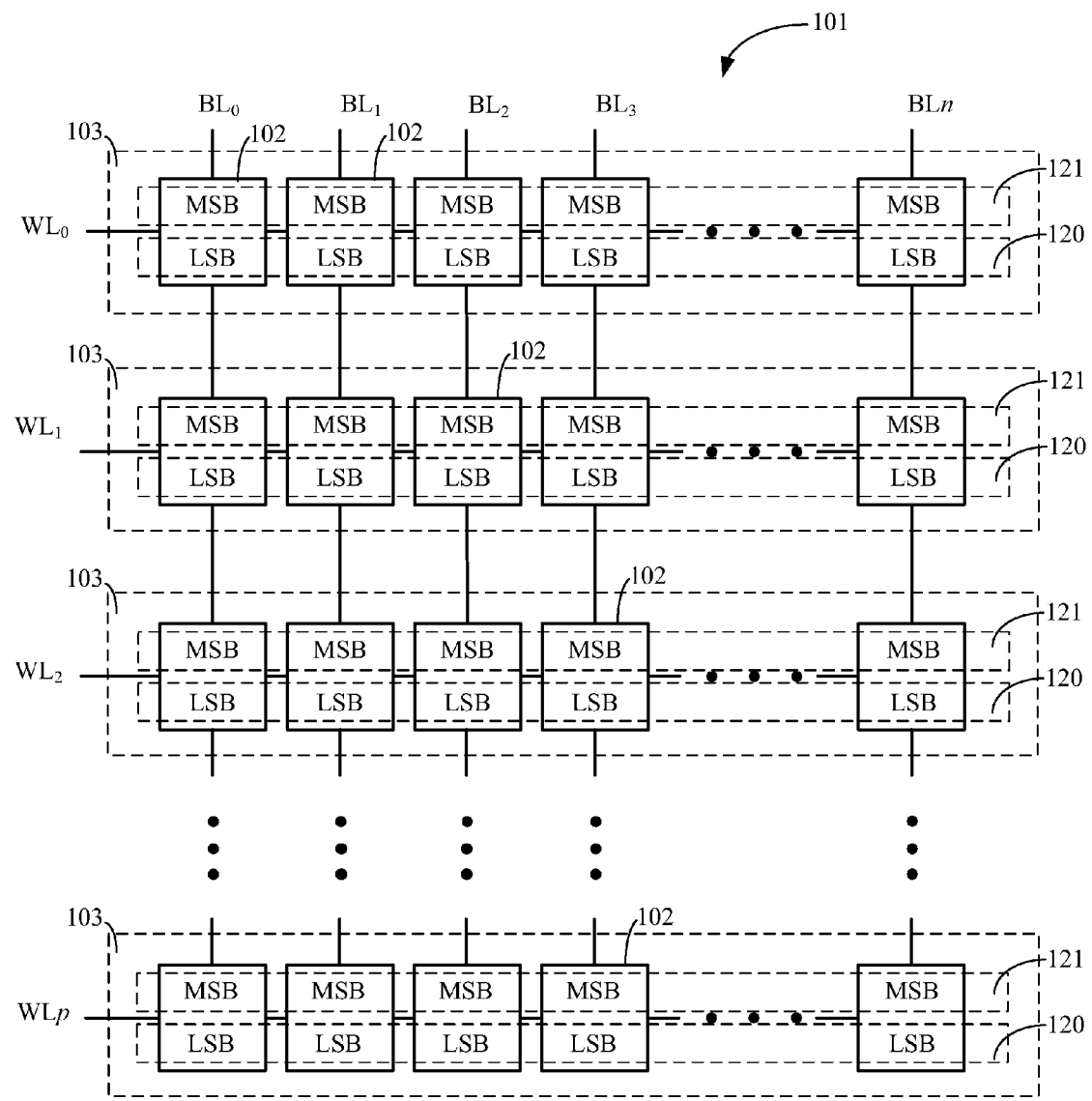
FIG. 1C illustrates memory cells capable of storing two bits of information in each cell, including a most significant bit (MSB) and a least significant bit (LSB)

The exemplary memory array 101 includes multi-level memory cells (floating gate transistors) 102 that are programmable to multiple voltage levels. For example, the memory cells may be programmable to four voltage levels and thus can store two bits of information per cell. FIG. 1C illustrates the block 101 of memory cells 102 that are capable of storing two bits of information denoted the most significant bit (MSB) and the least significant bit (LSB). Although this example involves multi-level memory cells that store two bits per memory cell, in general, multi-level memory cells may store three, four bits, five bits or even more bits per memory cell.

When multi-level memory cells are used to form the memory array, each physical page 103 can be subdivided into multiple logical pages 120, 121, as illustrated in FIG. 1C. One logical page 120, 121 for each type of bit is stored in the memory cells 102 of the physical page 103. Memory cell arrays that subdivide one physical page into multiple logical pages corresponding to the number of bits stored in multi-level memory cell is referred to herein as multi-page architecture. In the exemplary memory storage array block 101 illustrated in FIG. 1C, each physical page 103 associated with a word line $WL_1$-$WL_p$ is subdivided into two logical pages 120, 121. A first logical page 120 includes the LSBs of the memory cells 102 of the physical page 103. The second logical page 121 includes the MSBs of the memory cells 102 of the physical page 103. The logical pages 120, 121 associated with a physical page 103 are capable of being accessed (programmed or read) independently of each other. The LSBs stored in the memory cells of the physical page are accessed using a first logical page address and the MSBs stored in the memory cells of the physical page are accessed using a second logical page address.

In some implementations, the memory cell array can be arranged so that a word line is associated with multiple physical pages and each physical page is further subdivided into multiple logical pages according to the number of bits stored by each memory cell.

Figure 2:
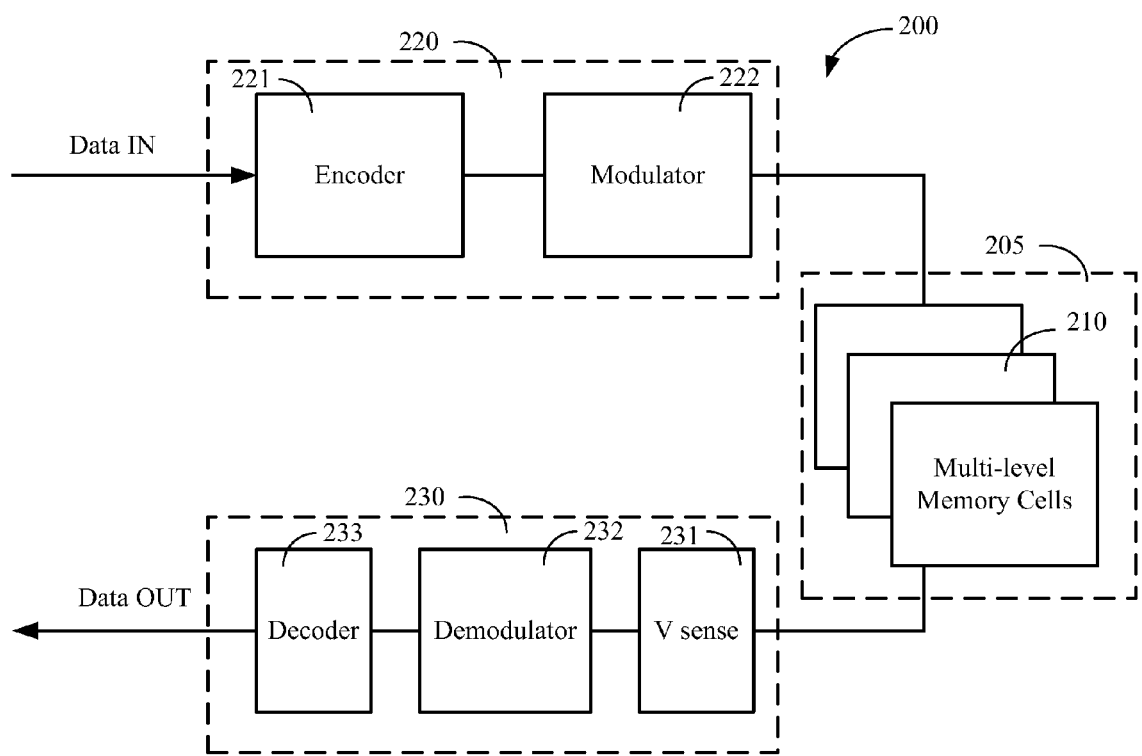
FIG. 2 is a block diagram of a memory device including multi-level memory cells.

FIG. 2 is a block diagram of a multi-level NVM device 200 including a memory cell array 205 comprising multi-level memory cells 210, input circuitry 220 configured to program data to the memory cells 210, and output circuitry 230 configured to read data from the memory cells 210. Error correction coding (ECC) is used to detect and/or correct data errors present in the data when the data is read from the memory cell array 205. The encoder 221 encodes the incoming data using the ECC into code words which are made up of the data bits and parity bits (redundant data). The modulator 222 conditions the encoded data output from the encoder to provide the signals required to program the multiple voltage levels into the memory cells 210. The logical pages of a physical page may be programmed into the memory cells at different times. For example, at a first time, the LSB bits forming a first logical page of data are encoded, modulated, and stored in the memory cells 210. At a second time, the MSB bits forming a second logical page are encoded, modulated, and stored in the memory cells 210 on top of the previously stored LSB page.

When data is read from the memory cells 210, voltage sense circuitry 231 senses the voltage levels present on the memory cells 210. The demodulator 232 converts the sensed voltages levels to encoded digital data. The decoder 233 decodes the encoded data and outputs decoded data for use by a host processor or other system component. In some implementations, the V sense circuitry 231 may be incorporated as a component of the memory cell array 205 and in some implementations, the V sense circuitry 231 may be incorporated in the demodulator, for example.

Figure 3:
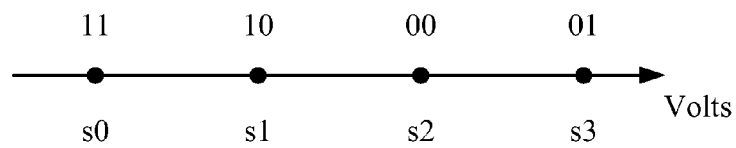
FIG. 3 illustrates voltage levels and corresponding binary states for two bit memory cells.

FIG. 3 illustrates the voltage levels and corresponding binary states for 2 bit memory cells. For example, voltages s0, s1, s2, s3 may be stored in the memory cells using Gray coding to represent the two bit binary states 11, 10, 00, 01, respectively. Thus, when the memory cell stores voltage level s0, this state corresponds to an MSB equal to 1 and an LSB equal to 1. The s1 state corresponds to an MSB equal to 1 and an LSB equal to 0. The s2 state corresponds to an MSB equal to 0 and an LSB equal to 0. The s3 state corresponds to an MSB equal to 0 and an LSB equal to 1.

Figure 4:
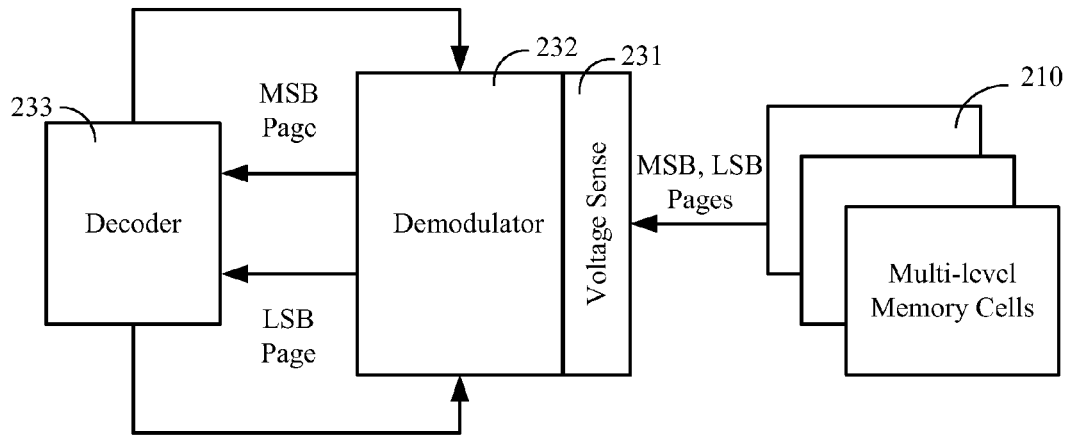
FIG. 4 is a block diagram of the output circuitry of a memory device that uses multi-page architecture.

FIG. 4 shows the output circuitry illustrated in FIG. 2 in more detail. As previously discussed, the data stored in the memory cells 210 are encoded using error correction coding (ECC) to facilitate error detection and/or error correction. For example, the data may be encoded using a low density parity check (LDPC) code, a turbo code, a Bose-Chaudhuri-Hocquenghem (BCH) code, a Reed Solomon (RS) code, or other type of code. Error correction codes add redundant information, such as parity bits, to the input data stream using a predetermined algorithm. Some error correction codes, such as BCH, operate on bits of information, whereas other error correction codes, Such as RS, operate on symbols (groups of bits).

Voltage sense circuitry 231 senses the voltage present on the bit lines of memory cells 210 as they are selected using the word lines. The demodulator 232 compares the sensed voltage of each memory cell 210 to one or more threshold voltages to determine the voltage level of the memory cell. Based on the comparison to the thresholds, the voltage level on each memory cell 210 can be translated into an m bit digital state, where m equals two for the four state memory cells 210 used in this example.

In addition to determining the digital state of the memory cells by comparison to thresholds as discussed above, the demodulator 232 may also determine data confidence information, denoted soft information, for each bit. Soft information provides a confidence level that the data reported by the demodulator corresponds to the data that was stored in the memory cell. Data errors may be introduced into the memory cells at various times, causing the voltage stored in the memory cell or read from the memory cell to differ from the data input.

The demodulator can be configured to generate bit level soft information for the MSB bit and/or the LSB bit of a memory cell from symbol level soft information, where a symbol comprises the two bit code for the MSB and LSB bits stored in a memory cell. Soft information may be obtained by the demodulator from several sources. In some implementations, the voltage sensor may be configured to acquire soft information by comparing the sensed voltage to one or more additional thresholds. In a multi-level memory cell capable of storing two bits of information, the voltage sensor may provide an x bit information word to the demodulator. The demodulator takes this x bit information word from the voltage sensor and generates an estimate of each data bit stored in the memory cell along with soft information comprising a y-1 bit indication of the confidence of the estimate. For example, the demodulator output may include as little as 1 bit of soft information per data bit that is useful in the decoding process.

The demodulator may use prior information to generate bit level soft information.

At the modulator and demodulator, consider an alphabet size of M, or $m = \log_2 M$ bits. In the modulator, m binary bits $b_0 b_1 \ldots b_{m-1}$ are mapped to a signal level in $x \in \chi$, that is, $$\mu: \{0,1\}^m \rightarrow \chi. \quad [1]$$

The prior probabilities are denoted by $p(b_k)$.

Let $l^i(x)$ denote the binary bit, or the label, on the ith bit of x. Let $\chi_b^i$ denote the subset of all $x \in \chi$ such that $l^i(x) = b$. For example, with m=2 and Gray mapping:

$$\{11, 10, 00, 01\} \rightarrow \{s_0, s_1, s_2, s_3\} \quad [2]$$

and $\chi_0^0 = \{2,3\}$, $\chi_1^0 = \{0,1\}$, $\chi_0^1 = \{1,2\}$, $\chi_1^1 = \{0,3\}$. For example, when the noise is additive Gaussian white noise (AGWN), the read sample $y_i$ for the ith memory state may be expressed as:

$$y_i = x_i + w(x_i), \quad [3]$$

where $x_i$ is the voltage that was stored in the memory cell, and $w(x_i)$ is a noise signal having a probability density function:

$$f(y|x_i) = \frac{1}{\sqrt{2\pi\sigma_i^2}} e^{\frac{(y-x_i)^2}{2\sigma_i^2}} \quad [4]$$

where $\sigma_i$ is the noise variance for the ith state.

For two bit memory cells, recall that the voltage stored in each cell corresponds to a two bit state. With Gray mapping, the two bit states { 11, 10, 00, 01} correspond to symbols $\{s_0, s_1, s_2, s_3\}$, as illustrated in FIG. 3. When the noise variance for each cell state is the same, then the error rate for the symbols is given by:

$$p_s = \frac{2(M-1)}{mM} Q\left(\frac{d}{2\sigma}\right) \quad [5]$$

where m is the number of bits that can be stored in a memory cell, M is the number of symbols (possible m-bit states), d is the distance the between the voltage levels of neighboring cells, $d = x_i - x_{i-1}$, and Q is the Gaussian error integral. If each symbol results in a single bit error, then the bit error rate is:

$$p_b = \frac{p_s}{m} \quad [6]$$

For each data bit of an LSB or MSB page, the demodulator 232 provides an output to the decoder 233 that includes an estimate of the state of the bit (either a 1 or a 0) along with the soft information which may be expressed as a log likelihood ratio (LLR). Let $l_i(x)$ denote the label on the ith bit of x.

For each data bit, $b_i$, the posterior soft information (LLR) coming out of the ith bit of the demodulator can be defined based on the probability ratio $p(b_i=0|y)/p(b_i=1|y)$ where $p(b_i=0|y)$ is the probability that bit $b_i$ is a 0 and $p(b_i=1|y)$ is the probability that bit $b_i$ is a 1. The LLR can be expressed as:

$$L_i(b_i \mid y) = \log\left(\frac{p(b_i = 0 \mid y)}{p(b_i = 1 \mid y)}\right) = \log\left(\frac{\sum_{x \in \chi_0^i} p(x \mid y)}{\sum_{x \in \chi_1^i} p(x \mid y)}\right) = \log\left(\frac{\sum_{x_j \in \chi_0^i} p(y \mid x_j)p(x_j)}{\sum_{x_j \in \chi_1^i} p(y \mid x_j)p(x_j)}\right). \quad [7]$$

In the absence of any prior information, [7] reduces to $$L_i(b_i \mid y) = \log\left(\frac{\sum_{x_j \in \chi_0^i} p(y \mid x_j)}{\sum_{x_j \in \chi_1^i} p(y \mid x_j)}\right) \quad [8]$$

In some implementations, the LLR for each bit is expressed in terms of a signed number. For example, the signed numbers can range from +10 to −10. The sign of the number represents the likely state of the bit, with a positive sign representing the logic state 1 and a negative sign representing the logic state 0. The magnitude of the number represents the degree of confidence in the estimated logic state. For example, a +1 output from the demodulator 232 can indicate that the bit is estimated to be a logic one, but confidence is low. A +5 can indicate that the bit is estimated to be a logic one and a +10 can represent that the bit is estimated to be logic one with high confidence. A −4 indicates that the bit is probably a logic zero.

Defining a vector $\tilde{l}^i(x) = \{l^j(x)\}$, $j \neq i$ of size (m−1) and assuming the independence of prior bit information, $$p(x) = p(l^i(x), \tilde{l}^i(x)) = p(l^i(x))p(\tilde{l}^i(x)), \quad [9]$$

then $$L_i(b_i \mid y) = \log\left(\frac{\sum_{x_j \in \chi_0^i} p(y \mid x_j)p(l^i(x_j) = 0)p(\tilde{l}^i(x_j))}{\sum_{x_j \in \chi_1^i} p(y \mid x_j)p(l^i(x_j) = 1)p(\tilde{l}^i(x_j))}\right). \quad [10]$$

For $x_j \in \chi_b^i$, $l^i(x_j) = b_i$, $L_i(b_i|y)$, Equation [10] can be expressed as:

$$L_i(b_i \mid y) = L_i(b_i) + \log\left(\frac{\sum_{x_j \in \chi_0^i} p(y \mid x_j)p(\tilde{l}^i(x_j))}{\sum_{x_j \in \chi_1^i} p(y \mid x_j)p(\tilde{l}^i(x_j))}\right), \quad [11]$$

where $L_i(b_i) = \log\left(\frac{p(b_i = 0)}{p(b_i = 1)}\right).$ [12]

Two types of prior information include prior information which comes from the decoder (e.g., LDPC decoder) and another source of prior information which comes from an external source. For example, the external source may provide information on position (beginning of page, end of page) that are more error prone. With prior information coming from the decoder denoted c, and prior information coming from the external source denoted $\bar{c}$, then:

$$L_i(b_i) = L_i^{(c)}(b_i) + L_i^{(\bar{c})}(b_i). \quad [13]$$

The extrinsic soft information is by definition $L_i^e(y) = L_i(b_i|y) - L_i^{(e)}(b_i)$, therefore from [11] and [13]:

$$L_i^e(y) = L_i^{(\bar{c})}(b_i) + \log\left(\frac{\sum_{x_j \in \chi_0^i} p(y \mid x_j)p(\tilde{l}^i(x_j))}{\sum_{x_j \in \chi_1^i} p(y \mid x_j)p(\tilde{l}^i(x_j))}\right). \quad [14]$$

Dividing both the numerator and denominator of the above equation with $p(\tilde{b}_i=1)$, where $\tilde{b}_i = b_1 b_2 \ldots b_m$ i.e the vector without $b_i$, then:

$$L_i^e(y) = L_i^{(\bar{c})}(b_i) + \log\left(\frac{\sum_{x_j \in \chi_0^i} p(y \mid x_j)\frac{p(\tilde{b}_i = \tilde{l}^i(x_j))}{p(b_i = 1)}}{\sum_{x_j \in \chi_1^i} p(y \mid x_j)\frac{p(\tilde{b}_i = \tilde{l}^i(x_j))}{p(b_i = 1)}}\right), \quad [15]$$

or $$L_i^e(y) = L_i^{(\bar{c})}(b_i) + \log\left(\frac{\sum_{x_j \in \chi_0^i} p(y \mid x_j)\left[\prod_{k \neq i} \frac{p(b_k = l^k(x_j))}{p(b_k = 1)}\right]}{\sum_{x_j \in \chi_1^i} p(y \mid x_j)\left[\prod_{k \neq i} \frac{p(b_k = l^k(x_j))}{p(b_k = 1)}\right]}\right). \quad [16]$$

Let $B \in \{0,1\}$ and define $$L_i(b_i, B) = \log\left(\frac{p(b_i = B)}{p(b_i = 1)}\right) = \begin{cases} L_i(b_i) & B = 0 \\ 0 & B = 1, \end{cases} \quad [17]$$

then, inserting [17] into [16], $$L_i^e(y) = L_i^{(\bar{c})}(b_i)\log\left(\frac{\sum_{x_j \in \chi_0^i} p(y \mid x_j)\left[\prod_{k \neq i} e^{L_k(b_k, l^k(x_j))}\right]}{\sum_{x_j \in \chi_1^i} p(y \mid x_j)\left[\prod_{k \neq i} e^{L_k(b_k, l^k(x_j))}\right]}\right). \quad [18]$$

Substituting [4] into [18], $$L_i^e(y) = L_i^{(e)}(b_i) + \log \left( \frac{\sum_{x_j \in \chi_0^i} e^{-\frac{(y-x_j)^2}{2\sigma_j^2} - \log(\sigma_j) + \sum_{k \neq i} L_k(b_k, l^k(x_j))}}{\sum_{x_j \in \chi_1^i} e^{-\frac{(y-x_j)^2}{2\sigma_j^2} - \log(\sigma_j) + \sum_{k \neq i} L_k(b_k, l^k(x_j))}} \right).$$ [19]

During the demodulation process, the right hand side of equation [19], may be obtained, for example, from a look-up table with input y.

In one example of multi-level memory, with m=2 and natural mapping, $\chi_0^0=\{0,1\}$, $\chi_1^0=\{2,3\}$, $\chi_0^1=\{0,2\}$, $\chi_1^1=\{1,3\}$ the two bit level extrinsic information can be calculated as:

$$L_i^e(y) = \log \left( \frac{\sum_{x_j \in \chi_0^i} e^{-\frac{(y-x_j)^2}{2\sigma_j^2} - \log(\sigma_j) + L_i(b_i, l^i(x_j))}}{\sum_{x_j \in \chi_0^i} e^{-\frac{(y-x_j)^2}{2\sigma_j^2} - \log(\sigma_j) + L_i(b_i, l^i(x_j))}} \right),$$ [20]

or $$L_0^e(y) = \log \left( \frac{e^{-\frac{(y-x_0)^2}{2\sigma_0^2} - \log(\sigma_0) + L_1(b_1, l^1(x_0))} + e^{-\frac{(y-x_1)^2}{2\sigma_1^2} - \log(\sigma_1) + L_1(b_1, l^1(x_1))}}{e^{-\frac{(y-x_2)^2}{2\sigma_2^2} - \log(\sigma_2) + L_1(b_1, l^1(x_2))} + e^{-\frac{(y-x_3)^2}{2\sigma_3^2} - \log(\sigma_3) + L_1(b_1, l^1(x_3))}} \right)$$ [21]

and $$L_1^e(y) = \log \left( \frac{e^{-\frac{(y-x_0)^2}{2\sigma_0^2} - \log(\sigma_0) + L_0(b_0, l^0(x_0))} + e^{-\frac{(y-x_2)^2}{2\sigma_2^2} - \log(\sigma_1) + L_0(b_0, l^0(x_2))}}{e^{-\frac{(y-x_1)^2}{2\sigma_1^2} - \log(\sigma_1) + L_0(b_0, l^0(x_2))} + e^{-\frac{(y-x_3)^2}{2\sigma_3^2} - \log(\sigma_3) + L_0(b_0, l^0(x_3))}} \right).$$ [22]

For a demodulator providing soft information (see, e.g., Equation [8]), with programmable $\{x_j, \sigma_j\}$, the demodulator can be implemented as a memory of size $2^{k_a} \times (m \times k_s)$, where $k_a$ could be the analog to digital converter (ADC) bus size and $k_s$ is the bus size of soft information. For example, with m=2, $(k_a,k_s)=(6, 4)$, the memory size becomes 64×8 which, when implemented in a memory chip having a 40 nm pitch occupies a small area.

A demodulator that inputs soft information and outputs soft information (see, e.g., Equation [18]) is more involved. The demodulator can be implemented as a memory of size $2^{k_a+(m-1)k_s} \times (m \times k_s)$. For example, with m=2, $(k_a, k_s)=(6,4)$, the memory size becomes 1024×8.

Alternatively, [18] can be approximated as:

$$L_i^e(y) = \log \left( \sum_{x_j \in \chi_0^i} e^{-\frac{(y-x_j)^2}{2\sigma_j^2} - \log(\sigma_j) + \sum_{k \neq i} L_k(b_k, l^k(x_j))} \right) -$$ [23]

$$\log \left( \sum_{x_j \in \chi_1^i} e^{-\frac{(y-x_j)^2}{2\sigma_j^2} - \log(\sigma_j) + \sum_{k \neq i} L_k(b_k, l^k(x_j))} \right)$$

or, $$L_i^e(y) = \max_{x_j \in \chi_0^i} \left\{ -\frac{(y-x_j)^2}{2\sigma_j^2} - \log(\sigma_j) + \sum_{k \neq i} L_k(b_k, l^k(x_j)) \right\} -$$
$$\max_{x_j \in \chi_1^i} \left\{ -\frac{(y-x_j)^2}{2\sigma_j^2} - \log(\sigma_j) + \sum_{k \neq i} L_k(b_k, l^k(x_j)) \right\}.$$ [24]

The branch metric $$-\frac{(y-x_j)^2}{2\sigma_j^2} - \log(\sigma_j)$$

can also be implemented as a memory with size $2^{k_a} \times (M \times k_b)$, where $k_b$ is the bus size of the branch metric. For example, with m=2, $k_a=6$, $k_b=5$, the branch metric memory is 64×20. To implement [24], each term in the max function needs m−1 adders, and maximization is over $2^{m-1}$ terms. Therefore, the total requirement is $m2^m+1$ adders and a memory size $2^{k_a} \times (M \times k_b)$. For the above example, the memory would be 64×20 followed by 9 adders. Information regarding iterative demodulation and decoding for jointly encoded logical pages is described in commonly owned U.S. Pat. No. 8,254,167, filed concurrently with the present application and incorporated herein by reference.

Returning to FIG. 4, the decoder 233 uses the output from the demodulator 232, including the data estimates and the soft information, to decode the MSB page and the LSB page. The decoder may also generate its own soft information, e.g., using the parity bits that provides an indication of the confidence of the decoded data bits. In some implementations, decoder 233 may comprise a low density parity check (LDPC) decoder. The MSB and LSB pages may be related by virtue of being stored together as voltages in memory cells of the same physical page. The information obtained in demodulating the MSB page can be used in decoding the LSB page and/or generating the soft information for the LSB page. Information obtained in demodulating the LSB page can be used in decoding the MSB page and/or generating the soft information for the MSB page. Additionally, information obtained in decoding the MSB page may be used in further refining the demodulation of the MSB and LSB pages and information obtained in decoding the LSB page may be using in further refining the demodulation of the MSB and LSB pages.

As the code words of the logical pages are decoded, based on the results of the parity checks, the decoder generates updated soft information indicating the confidence or reliability of each bit decision. The soft decisions produced by decoder 233 and the demodulator 232 can be generated with a technique called "message passing." For example, decoder 233 can upgrade or degrade the data confidence information received from the demodulator depending on whether the code word parity bits match or do not match the corresponding data in the code word. The updated soft information is passed back to demodulator 232 which uses the updated soft information provided by decoder 233 as extrinsic information and again interprets the sensed voltage from the memory cells to produce updated estimates of the data and soft information. The demodulator's estimates and soft information are again passed to decoder 233. This iterative process may continue any number of times until the decoder 233 achieves convergence of the code word, or a predetermined number of iterations are performed, or the decoder 232 determines that the code word cannot be converged.

The iterative demodulation/decoding processes described herein are particularly useful for memory devices employing multi-level coding. As previously discussed, the MSB and LSB pages are independently encoded and then are stored together in a physical memory page. Each bit of the MSB page has a corresponding bit from the LSB page. These bits are related to each other because they are stored together as a voltage level present on a memory cell. Thus, information gained from demodulating and/or decoding one of the pages can be used to improve the process of demodulating and decoding of the other page, and vice versa, thereby increasing the efficiency of the demodulation/decoding process.

Figure 5:
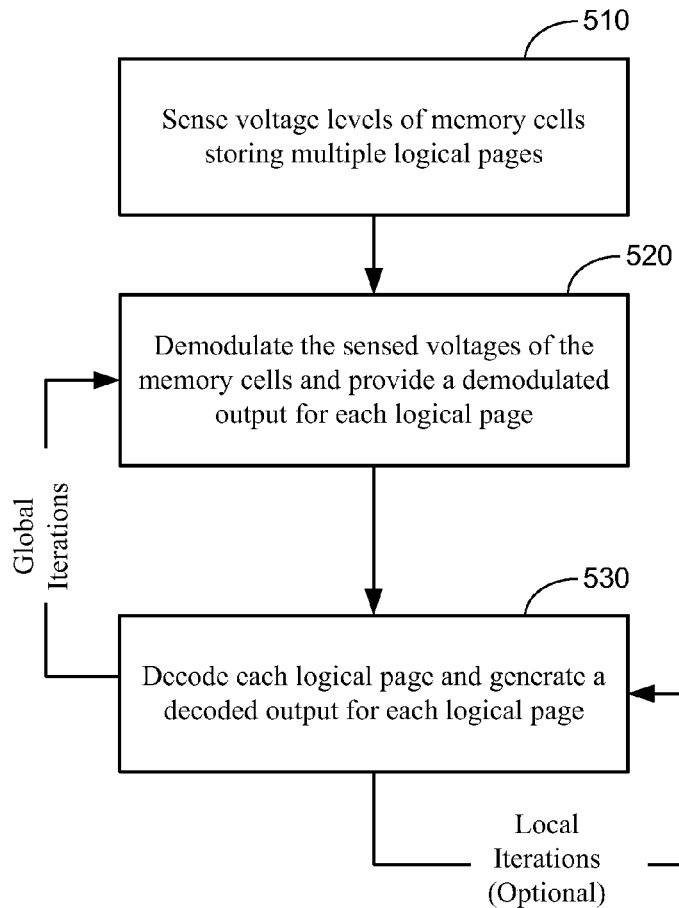
FIG. 5 is a flow diagram illustrating an iterative process for demodulating and decoding data stored in multi-page architecture memory devices.

FIG. 5 is a flow diagram illustrating a method of accessing data stored in a multi-level NVM device using multi-page architecture. The voltage level of each memory cell is sensed 510 and the sensed voltage is demodulated 520 to produce a demodulated output for each page. Each of the demodulated outputs are decoded 530 to produce a decoded output for each page. Decoding each page and demodulating the multiple pages proceeds iteratively, providing hard data estimates for the data bits with or without soft information giving the reliability of the hard data estimates exchanged between the decoding and demodulating steps.

In some implementations, only the hard data estimates, i.e., the demodulated bits read from the memory cell or the decoded output from the decoder without confidence information) are iteratively passed between the decoder and the demodulator. In other implementations, the decoder iteratively passes the hard data estimates to the demodulator and also calculates soft information, e.g., an LLR, which is also passed to the demodulator. In this scenario, the demodulator uses the soft information provided by the decoder, but does not calculate or provide soft information to the decoder. For example, the demodulator does not itself calculate confidence information to update the soft information provided by the decoder. In yet another implementation, both the decoder and the demodulator provide a hard data estimates and soft information. The demodulator provides hard data estimates and soft information for each cell in which the multiple logical pages are stored to the decoder. The decoder provides hard data estimates and soft information for each bit of each page to the demodulator. This process proceeds iteratively until convergence, timeout or another criterion is achieved.

Iterations between demodulating and decoding each page can involve extrinsic information in the form of updated data bit estimates and/or updated soft information which are passed between the demodulator and the decoder. These iterations that pass extrinsic information between the demodulator and decoder are designated global iterations. In addition to the global iterations, one or more of the demodulator and the decoder may optionally perform local iterations. For example, the decoder may be a low density parity check (LDPC) decoder, a turbo coder, or other type of iterative decoder which iterates the decoding process locally within the decoder (without extrinsic information) to obtain convergence for the code words.

Figure 6:
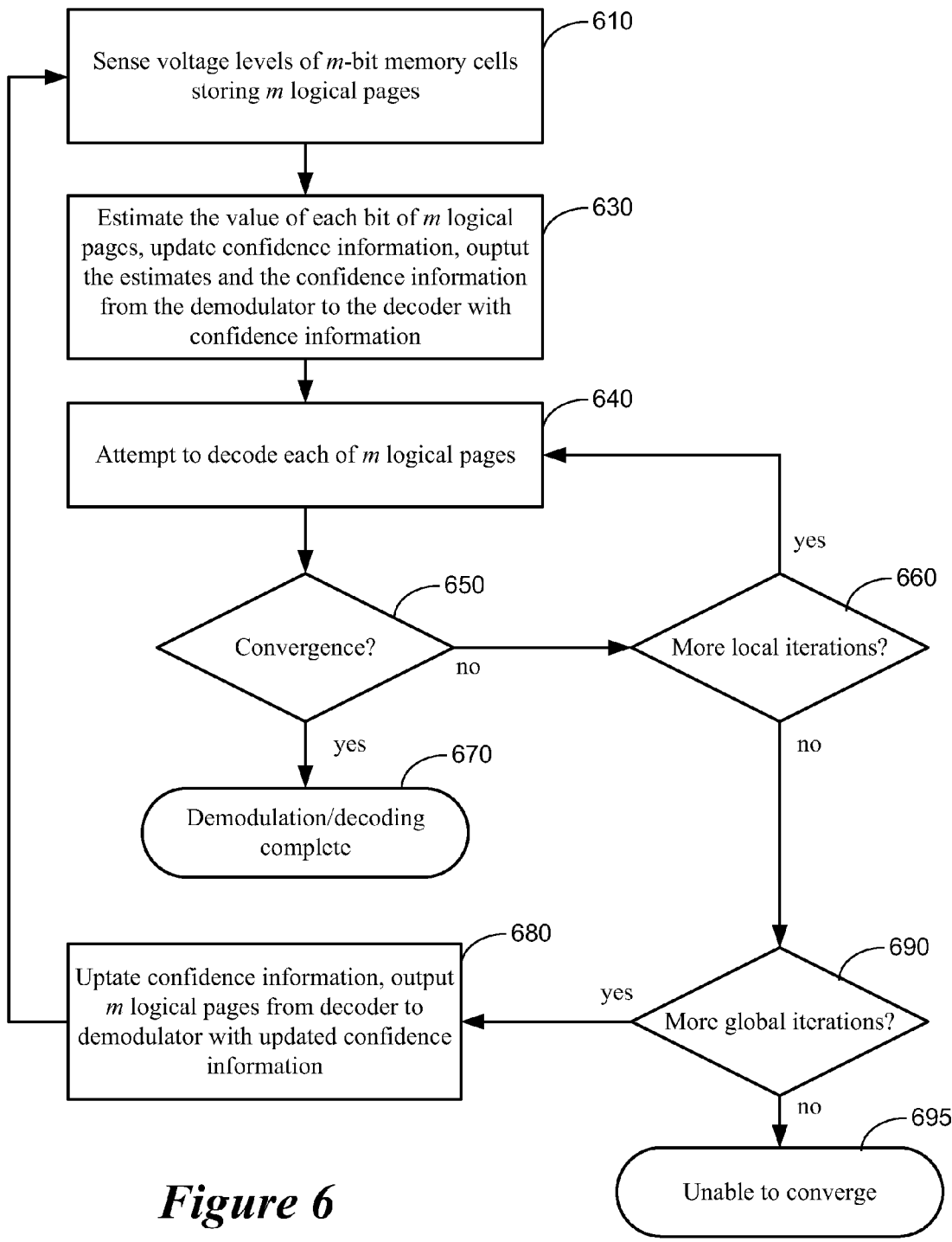
FIG. 6 is a flow diagram illustrating a process for demodulation and decoding data that includes performing both global iterations between the demodulator and the decoder and local iterations within the decoder.

FIG. 6 is a flow diagram illustrating a process of accessing a solid state NVM device comprising multi-level memory cells capable of storing m bits per memory cell, each of the m bits of a memory cell arranged in one of m logical pages of each physical page. The process includes performing both global iterations between the decoder and the demodulator and local iterations within the decoder. According to the illustrated process, the voltage levels of the multi-level memory cells are sensed 610. The sensed voltage levels are processed in the demodulator which provides 630 an estimate of the m bit digital state of each memory cell and outputs the estimates as m logical pages of data to the decoder. In addition to the estimate of value of the bits of the m logical pages of data, the demodulator also provides the decoder with soft information for each bit of each logical page. The soft information may be derived from the sensed voltage levels of the memory cells and may be expressed as an LLR, for example.

The decoder inputs the estimate of the m logical pages of data and the soft information from the demodulator and attempts to decode 640 each of the m logical pages using the estimates and soft information. The decoder performs 660 up to a predetermined number of local decoder iterations. If the code words of the m pages converge 650, then the decoding process is complete 670 and the decoded data for the requested page or for each page of the m pages is available at the output of the memory device. If the code words of the m pages do not converge 650, additional global iterations between the decoder and the demodulator may be performed 690. The decoder updates 680 the soft information, e.g. updates the LLR, and outputs the decoded data and the updated soft information for the m logical pages to the demodulator for another global iteration. The sensed voltage levels are re-assessed by the demodulator using the decoded data and the updated soft information from the decoder. The process may involve up to a predetermined number of global iterations 690. After globally iterating the predetermined number of times, the process may exit if convergence is not achieved 695.

Figure 7:
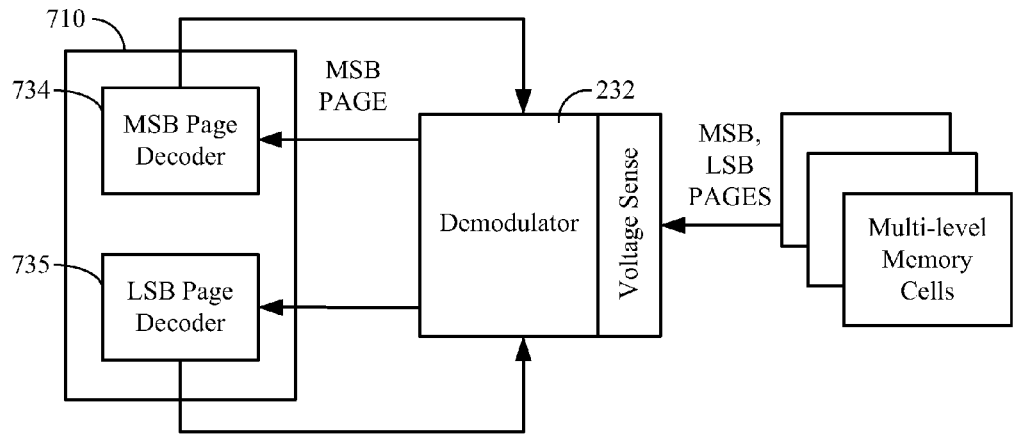
FIG. 7 is a block diagram illustrating output circuitry that includes decoders that are not sequentially coupled.

In some implementations, the decoders for each page may be arranged to provide non-sequential operation, wherein the output of each decoder does not provide an input to any other decoder. Such an arrangement is illustrated in FIG. 7. The decoder 710 in FIG. 7 includes an MSB page decoder 734 which decodes the MSB page and an LSB page decoder 735 that decodes the LSB page. The MSB and LSB page decoders 734, 745 each globally iterate with the demodulator 232 as previously discussed. In addition, one or both of the MSB and LSB page decoders 734, 745 may also perform local iterations. For example, one or both of the decoders may comprise an LDPC decoder.

Figure 8:
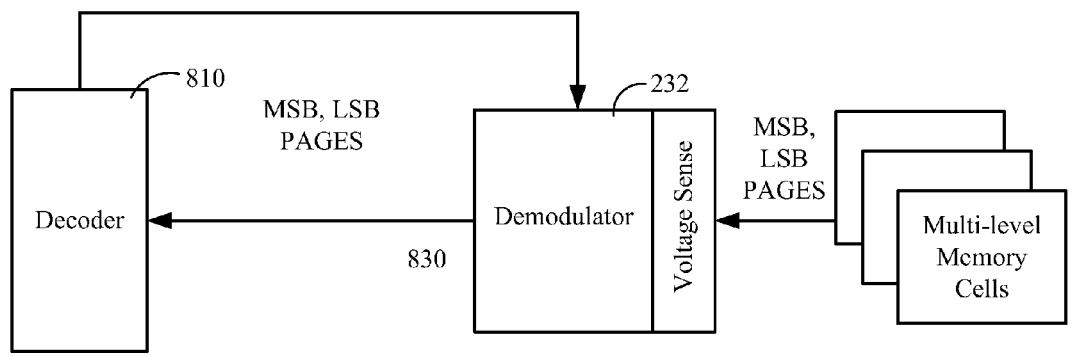
FIG. 8 is a block diagram illustrating output circuitry that includes decoders that are sequentially coupled.

In some implementations, the decoder circuitry may perform some operations sequentially, for example, by processing a first page of data before processing a second page of data. A sequential operation arrangement is illustrated in FIG. 8. The decoder 810 in FIG. 8 is arranged to sequentially decode the MSB page during a first time interval and to decode the LSB page during a second time interval. The decoded LSB and MSB page information is output to the demodulator. The LSB and MSB information provided by the demodulator and/or the decoder may or may not include confidence information. The decoder may comprise an iterative decoder, such as an LDPC decoder, that performs local iterations. Global iterations between the demodulator and the decoder may also be performed.

The memory cells of a solid state NVM device are typically read one logical page at a time. However, iteratively demodulating and decoding data stored in multi-level memory cells arranged in a multi-page architecture as described herein provides multiple logical pages of data. For example, if each physical page of the memory cell array includes memory cells that store an MSB page and an LSB page, iteratively demodulating and decoding will result in both the MSB page and the LSB page being available at the output of the decoders.

Figure 9:
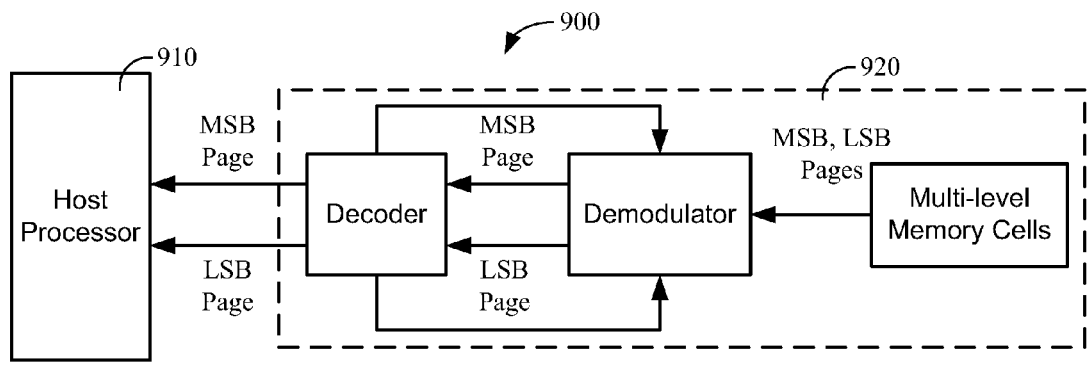
FIG. 9 is a block diagram of a system that is sending all decoded pages to a host processor.
Figure 10:
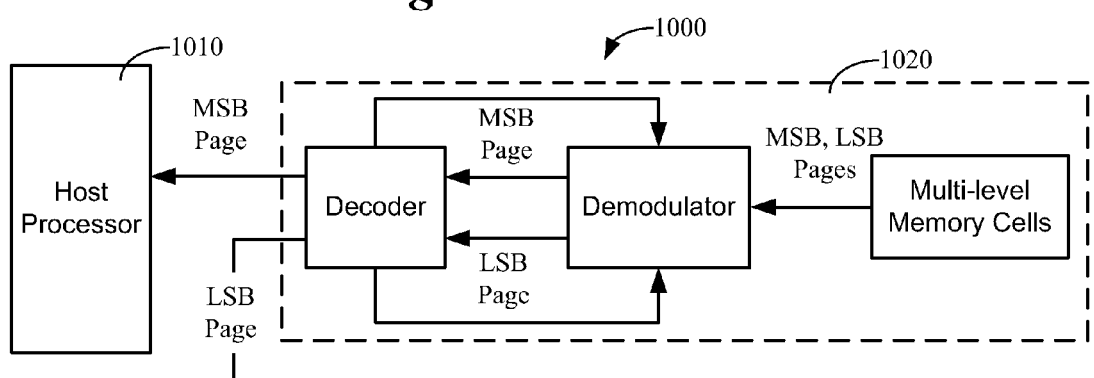
FIG. 10 is a block diagram of a system that is sending a requested decoded page to a host processor and is discarding or ignoring a non-requested decoded page.
Figure 11:
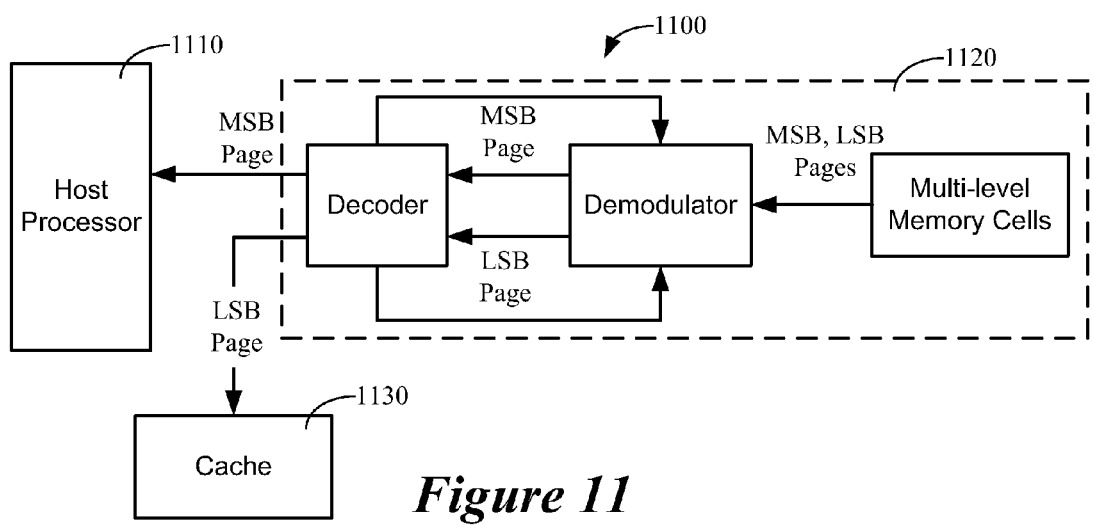
FIG. 11 is a block diagram of a system that is sending a requested decoded page to a host processor and is caching a non-requested decoded page.

FIGS. 9-11 are block diagrams of systems that handle a non-requested logical page of data in various ways. In each example, the MSB page is requested by the host processor (or other requesting device). In FIG. 9, the LSB page is also requested by the host and in FIGS. 10-11, the LSB page is not requested. Alternatively, the LSB page may be the requested page and the MSB may be the non-requested page. In implementations that include a greater number of bits stored per memory cell (greater than 2 bits), more than one logical page may be requested and/or more than one logical page may be non-requested.

FIG. 9 illustrates a system 900 including a host processor 910 and a solid state NVM device 920 that is providing both the requested MSB page and the requested LSB page to the host processor. For example, the processor 910 may be performing a block read of all logical pages in a block which includes both the MSB page and the LSB page.

FIG. 10 shows a block diagram of a system 1000 including a solid state NVM device 1020 that is transferring the requested logical page to the host processor 1010 and discarding or ignoring the non-requested page. The non-requested page may be discarded or ignored, for example, if it is unlikely that the non-requested page will be needed soon. FIG. 11 shows a block diagram of a system 1100 comprising a NVM device 1120 that includes a cache 1130 configured to store one or more non-requested pages. The cached pages may be temporarily stored until requested by the host processor 1110 or until overwritten by subsequently cached pages, for example.

Any of the processes illustrated in FIGS. 9-11 may be alternatively available. When the NVM device receives a request for a logical page from a host processor, either the host processor may indicate of how to handle the non-requested page, or the NVM device itself may determine how to handle the non-requested page. For example, in some scenarios, the host processor may indicate that it will accept both the requested page and the non-requested page. In some scenarios, the process for handling the non-requested page may be determined by the NVM device based on prior host processor activity. The NVM device may determine the likelihood that the non-requested page will be requested within a predetermined time interval. If it is likely that the host processor will request the non-requested page within the predetermined time interval, then the non-requested page may be stored in cache. However, if it is unlikely that the non-requested page will be requested during the predetermined time interval, then the non-requested page may be discarded.

Figure 12:
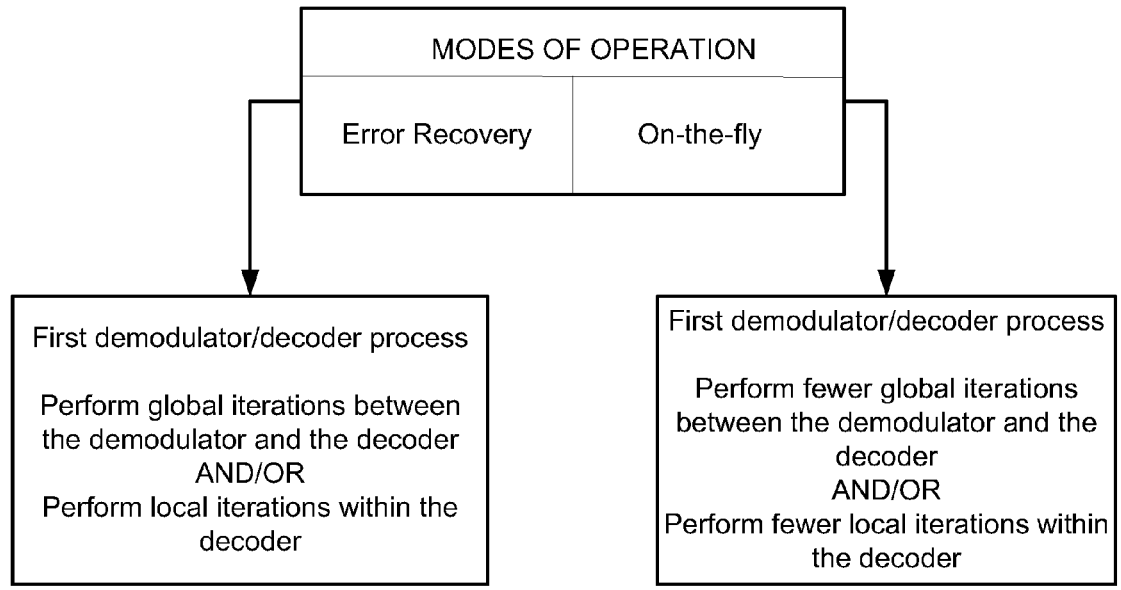
FIG. 12 is a diagram illustrating multiple modes of error detection/correction operation, wherein each of the modes of operation uses a different demodulation/decoding process.

As illustrated by FIG. 12, a memory device may operate in an error correction mode, designated error recovery (ER) mode, or may operate in a non-error correction mode, designated on-the-fly (OTF) mode. When operating in the OTF mode, the memory device may attempt to detect that the data contains errors but may or may not attempt to correct the errors. Alternatively, some OTF modes may not even attempt to detect data errors. When operating in the ER mode, the memory device attempts to detect that the data contains errors and also attempts to correct the data errors.

OTF modes that do not provide error correction may be used, for example, when the number of the data errors is expected to be low and/or when access speed is more important than error correction and/or when the data can be re-transmitted if an error occurs. When data accuracy is important, access speeds can be slower, and/or if re-transmission is not available, then the memory device may operate in ER mode. The device may switch between the ER mode and the OTF mode depending on the requirements of the operation. The ER and OTF modes may be provided by two output circuits, at least one output circuit having a substantial amount of circuitry that is not common to the other output circuit. The ER circuitry may be more complex than the OTF circuitry. In this implementation, the ER mode circuits will be triggered for use when the NVM device is operating in ER mode and the OTF circuitry will be triggered for use when the NVM device is operating in OTF mode.

In another implementation, both the OTF and ER modes may be provided by an output circuit capable of operating in an ER mode during a first time period and an OTF mode during a second time period. In this implementation, the ER and OTF modes use substantially the same circuitry but the circuitry performs a more complex process when operating in the ER mode than when operating in the OTF mode. For example, when operating in the ER mode, the demodulator and decoder perform global iterations and/or the decoder performs local iterations. When operating in OTF mode, the demodulator and decoder perform fewer global iterations than the number of global iterations performed in the ER mode, or the OTF mode may perform no global iterations. When operating in OTF mode, the decoder performs fewer local iterations than the number of local iterations performed the ER mode, or the OTF mode may perform no local iterations.

There are a number of different types of ECC that may be used to encode the data prior to modulation and storage in the memory storage cells. More specifically, there are a number of linear block codes, such as Reed Solomon codes, Hamming codes and LDPC codes, that operate on blocks of data and are useful for NVM devices. In general, ECC having the ability to correct more errors involve higher system overhead because more parity bits are used and/or because of increased computational complexity. The higher system overhead may be manifested as slower encoding/decoding rates and/or more complex hardware and/or software for encoding and/or decoding.

The code rate of an ECC expresses the amount of redundancy required by the code. Different types of ECC may have different code rates. As an example, if the data to be transmitted is u bits, then the encoding process for the ECC adds r bits to the u data bits to form a code word v=u+r bits. The code rate of the ECC is expressed as u/v.

Figure 13:
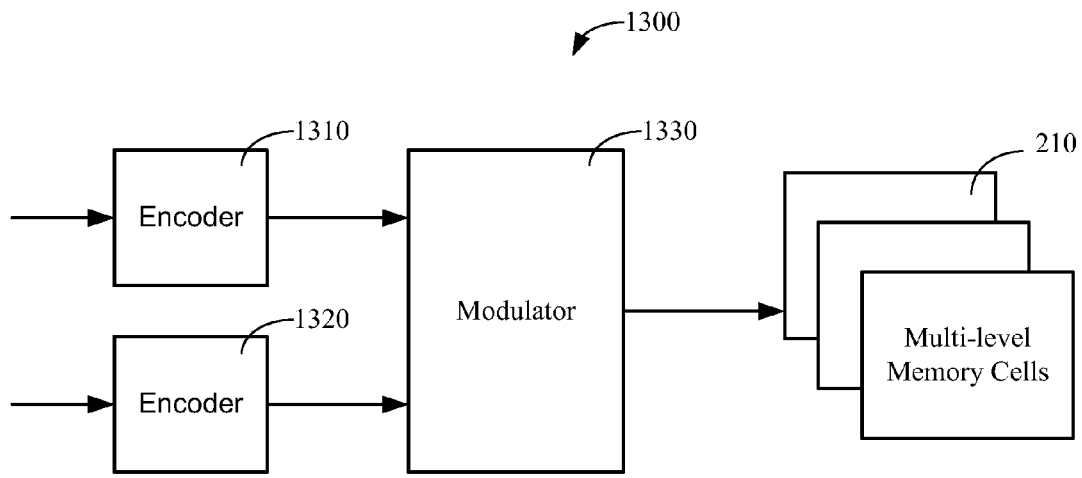
FIG. 13 is a block diagram illustrating input circuitry for a memory device using multi-page architecture.

In multi-level memory cell implementations, each logical page stored in a physical page of the memory cells may be encoded using a different type of ECC. Alternatively, the logical pages may use the same ECC but each logical page has a different code rate. FIG. 13 illustrates input circuitry 1300 that includes a first encoder 1310 using a first ECC used to encode a first logical page and a second encoder 1320 used to encode a second logical page. The first ECC used by the first encoder 1310 is more computationally complex and provides a more robust error correction capability and the second ECC is less computationally complex and provides a less robust error correction than the first ECC. After encoding, both logical pages are modulated by the modulator 1330 and stored in the multi-level memory cells 210. For example, the first ECC used by the first encoder 1310 may be used to encode pages that are more likely to contain errors to improve the error rate of these pages and thus improve the overall error rate of the NVM device. For example, the first ECC may encode the pages that have a higher likelihood of error using a lower code rate. In some configurations, the LSB pages are more prone to error than the MSB pages. To improve the overall error rate, the LSB pages can be encoded with a more robust type of ECC and/or a lower code rate than the type of ECC and/or the code rate used for the MSB pages.

Figure 14:
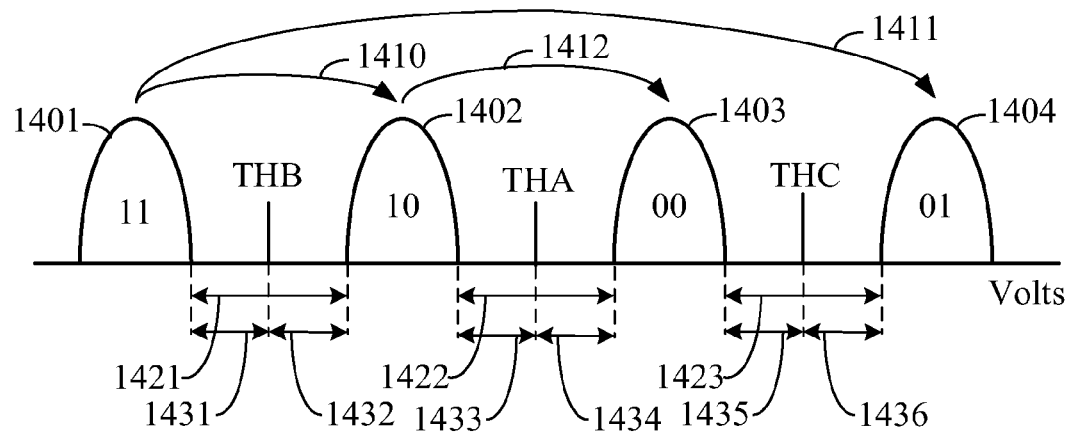
FIG. 14 illustrates a voltage distribution pattern of the four voltage distributions that correspond to the four digital states of a two bit memory cell.

Another technique to lower the error rate of the LSB page involves altering the distributions of the voltages stored in the memory cells. FIG. 14 illustrates voltage distributions for each 2 bit symbol of a memory cell array. In this example, the digital state 11 requires the lowest voltage and may represent the erased state. The voltages representing 11 fall within distribution 1401. Similarly, after programming, the voltages representing 10 fall within distribution 1402, the voltages representing 00 fall within distribution 1403, and the voltages representing 01 fall within distribution 1404. Prior to programming a memory cell array block, the memory cells are erased, bringing all the bits to their erased state, which in this example is 11. The LSB is programmed into the memory cell first. If the LSB is 1, no programming voltage is applied and the memory cell remains in the erased state, 11. If the LSB is 0, then a programming voltage is applied which raises the voltage stored in the memory cell to the voltage representing the digital state 10 (path 1410). Next, the MSB is programmed into the memory cell. If the MSB to be programmed is a 1, then no programming voltage is applied, because the memory cell is already in the correct state, either 11 or 10, depending on the LSB programming. If the MSB to be programmed is a 0 and the memory cell is in the 11 state (LSB equal to 1), then a programming voltage is applied which raises the voltage stored in the memory cell to the voltage 01 (path 1411). If the MSB to be programmed is a 1 and the memory cell is in the 10 state (LSB equal to 0), then a programming voltage is applied which raises the voltage stored in the memory cell to the voltage 00 (path 1412).

Programming may occur, for example, applying the programming voltage to the memory cells in steps to raise the memory cell voltage to the desired level. In some applications, after applying the programming voltage, the stored voltage level of the memory cell is verified. Multiple programming cycles and/or verify cycle may occur until the stored voltage levels on the memory cells corresponds to the desired distribution, e.g., distribution 1401, 1402, 1403, 1404. The shape of the distribution 1401, 1402, 1403, 1404 can be controlled based on the number of programming steps. Decreasing the variance of a distribution can be achieved if many programming steps are used, wider distributions require fewer programming steps. Correspondingly, programming narrow distributions is slower than programming wider distributions due to the added programming steps used in programming the narrower distributions when compared to the wider distributions.

Reading the digital state of a memory cell may be accomplished by comparing the sensed voltage levels of the memory cells to one or more thresholds. Comparison to a first threshold A, THA, discriminates the MSB bit of the digital state stored in the memory cell. If the sensed voltage is lower than THA, then the state of the MSB is 1 and if the sensed voltage is greater than THA, then the state of the MSB is 0.

Reading the LSB requires comparison to at least two thresholds. If the sensed voltage is less than THA, then comparison to threshold B, THB, discriminates between an LSB of 1 and an LSB of 0. If the sensed voltage is less than THB, then the LSB stored in the memory cell is 1. If the sensed voltage is greater than THB, then the LSB stored in the memory cell is 0. If the sensed voltage is greater than THA, then comparison to threshold C, THC, discriminates between an LSB of 1 and an LSB of 0. If the sensed voltage is greater than THC, then the LSB is 1. If the sensed voltage is less than THC, then the LSB is 0.

The distances between the edges of the distributions 1401, 1402, 1402 and the location of the thresholds affect the error rate of the memory cells. If the edges of the distributions 1401, 1402, 1402 overlap, then data errors can occur. Additionally, if any of distributions overlap the thresholds THA, THB, THC, then data errors can occur. Thus it is desirable to maintain acceptable distribution margins 1421, 1422, 1423 between the edges of the distributions 1401, 1402, 1402 and to maintain acceptable threshold margins 1431, 1432, 1433, 1434, 1435, 1436, between the edges of the distributions 1401, 1402, 1402 and the thresholds, THA, THB, THC. FIG. 14 illustrates distribution margins 1421, 1422, 1423 between an edge of one distribution and an edge of an adjacent distribution that are approximately uniform. FIG. 14 illustrates threshold margins 1431, 1432, 1433, 1434, 1435, 1436, between a distribution edge and a threshold that are approximately uniform.

Figure 15:
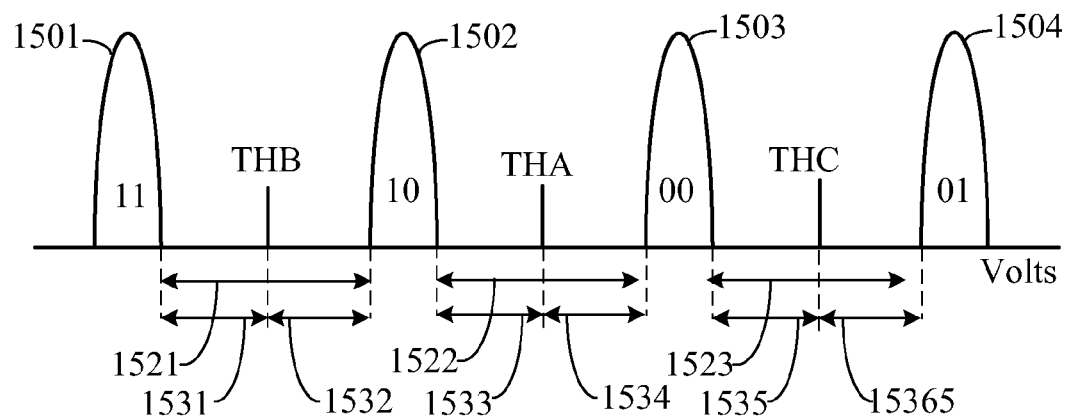
FIG. 15 illustrates narrower voltage distributions which increase the distribution margins and threshold margins.

FIG. 15 illustrates voltage distributions 1501, 1502, 1503, 1504 that have a smaller variance than the voltage distributions 1401, 1402, 1403, 1404 shown in FIG. 14. Decreasing the variance of voltage distributions increases both the distribution margins 1521, 1522, 1523 and the threshold margins 1531, 1532, 1533, 1534, 1535, 1536. This increase in distribution margins and threshold margins reduces errors and is achieved at the expense of longer programming times. The voltage distribution pattern illustrated in FIG. 15 involves distribution margins 1521, 1522, 1523 and threshold margins 1531, 1532, 1533, 1534, 1535, 1536 that are substantially uniform.

Figure 16A:
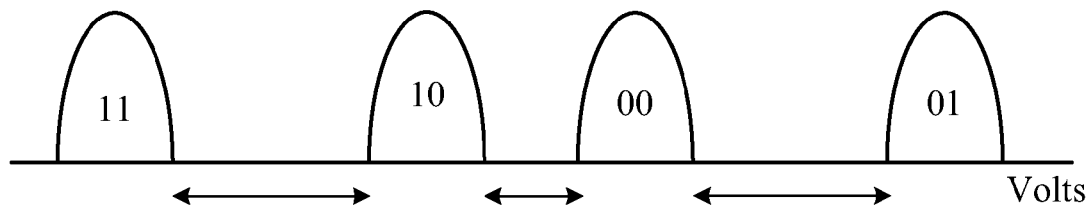
FIG. 16A illustrates a voltage distribution pattern resulting from reducing the voltage difference between the 10 and 00 distributions.
Figure 16B:
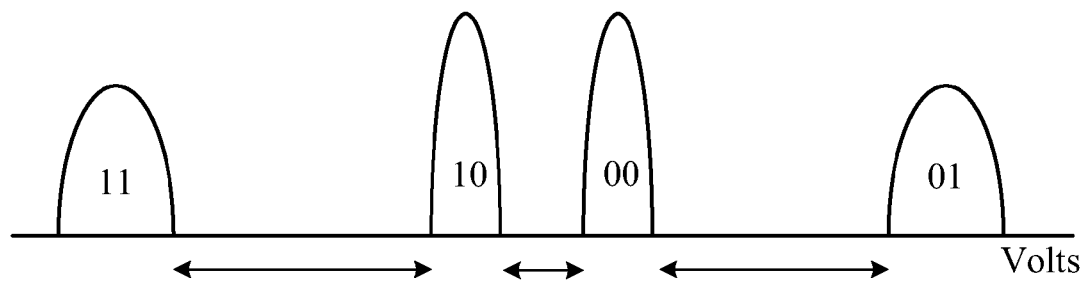
FIG. 16B illustrates a voltage distribution pattern resulting from reducing the voltage difference between the 10 and 00 and decreasing the variance of the distributions.

Program disturbs and read disturbs are more likely to occur at lower voltage levels, such as digital states 11 and 10 which affect the LSB. FIGS. 16A and 16B illustrate various voltage distribution patterns that have non-uniform distribution margins which may be used to decrease the error rate of the LSB page. For example, as illustrated in FIG. 16A, the 10 and 00 distributions may be shifted closer together and towards each other, which correspondingly increases the margin between the 11 distribution and the 10 distribution and between the 00 distribution and the 01 distribution. The distribution margins are no longer uniform, and the increased margin between the 11 and 10 distributions makes it easier to discriminate between an LSB of 1 and an LSB of 0 when the MSB is 1. FIG. 16B illustrates both shifting the 10 and 00 distributions and decreasing the variance of the 10 and 00 distributions. This distribution pattern may decrease errors in the LSB page without substantially affecting the error rate for the MSB page. A number of additional distribution patterns are possible and are considered to fall within this disclosure.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method of accessing encoded data stored in a solid state non-volatile memory device, comprising:
   sensing voltage levels of memory cells arranged to store multiple bits of data per memory cell, the multiple bits per memory cell associated respectively with multiple pages of data, each bit stored in a memory cell associated with a page of data that is different from other pages associated with other bits stored in the memory cell;
   demodulating the multiple pages of the memory cells responsive to the sensed voltage levels including providing a demodulated output for each page of the multiple pages; and
   generating a decoded output for each page of the multiple pages, wherein generating the decoded output for each page comprises:
      receiving the demodulated output for the page;
      decoding the page responsive to the demodulated output; and
      iterating between decoding and demodulating the multiple pages including exchanging information between the decoding and the demodulating.

2. The method of claim 1, wherein exchanging the information comprises exchanging one or both of hard data estimates and data confidence information.

3. The method of claim 2, wherein the data confidence information for one page is derived from decoding another page.

4. The method of claim 2, wherein the data confidence information for one page is derived from demodulating the multiple pages.

5. The method of claim 2, wherein the data confidence information is based on noise probability.

6. The method of claim 1, further comprising:
   ignoring a decoded output of at least one page; and
   transferring a decoded output of at least another page to a host computer.

7. The method of claim 1, further comprising:
   using a first process for memory access with error recovery; and
   using a second process for on-the-fly memory access.

8. The method of claim 7, wherein the first process comprises an iterative process and the second process performs fewer iterations than the first process or performs no iterations.

9. The method of claim 1, wherein decoding the page comprises decoding the page using a low density parity check decoder or a turbo code decoder.

10. The method of claim 1, wherein at least one page of the multiple pages is encoded using a code rate that is different from a code rate of another page of the multiple pages.

11. The method of claim 10, further comprising selecting a code rate for at least one page of the multiple pages to reduce an error rate of one of the multiple pages relative to an error rate of another of the multiple pages.

12. The method of claim 1, wherein one or both of the decoding and the demodulating comprises performing local iterations, each local iteration using information from at least one previous iteration of the decoding or demodulating.

13. A memory system, comprising:
   memory cells configured to store multiple bits of data per memory cell, the multiple bits per memory cell associated respectively with multiple pages of data, each bit stored in a memory cell associated with a page of data that is different from other pages associated with other bits stored in the memory cell;
   sensor circuitry configured to sense voltage levels indicative of the multiple bits stored in the memory cells;
   a demodulator configured to provide a demodulated output for each page of the multiple pages responsive to the sensed voltage levels; and
   a decoder configured to receive a demodulated output for each page of the multiple pages from the demodulator and to send an output to the demodulator, the decoder and the demodulator configured to exchange information and to iteratively perform the processes of decoding and demodulating the multiple pages.

14. The system of claim 13, wherein the information includes hard data estimates and data confidence information.

15. The system of claim 14, wherein the demodulator is configured to implement a look-up table to determine the data confidence information.

16. The system of claim 14, wherein the demodulator is configured to calculate a function of a probability function to determine the data confidence information.

17. The system of claim 14, wherein the demodulator is configured to determine the data confidence information based on the sensed voltage levels of the memory cells.

18. The system of claim 13, further comprising a host computer, wherein the decoder is configured to transfer a decoded output for one page of the multiple pages to the host computer and to discard a decoded output of another page of the multiple pages.

19. The system of claim 13, further comprising a cache memory and a host computer, wherein the decoder is configured to provide a decoded output of at least one page for storage in the cache memory and to provide a decoded output of at least another page to the host computer.

20. The system of claim 13, wherein each state of the multiple bits of each memory cell is represented by a memory cell voltage and voltage differences between adjacent voltages that represent different memory states is non-uniform.

* * * * *